US006919236B2

(12) United States Patent
Wei et al.

(10) Patent No.: US 6,919,236 B2
(45) Date of Patent: Jul. 19, 2005

(54) BIASED, TRIPLE-WELL FULLY DEPLETED SOI STRUCTURE, AND VARIOUS METHODS OF MAKING AND OPERATING SAME

(75) Inventors: Andy C. Wei, Radebeul/Dresden (DE); Derick J. Wristers, Bee Caves, TX (US); Mark B. Fuselier, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/104,939

(22) Filed: Mar. 21, 2002

(65) Prior Publication Data

US 2003/0178622 A1 Sep. 25, 2003

(51) Int. Cl.⁷ .............................................. H01L 21/00
(52) U.S. Cl. ..................... 438/149; 438/282; 438/479; 438/517; 257/347; 257/348
(58) Field of Search ............................. 438/149, 282, 438/298, 910, 479, 517; 257/347–350, E27.112, E21.32, E21.545, E21.561, E21.564

(56) References Cited

U.S. PATENT DOCUMENTS

| | | | | | |
|---|---|---|---|---|---|
| 5,359,219 A | * | 10/1994 | Hwang | ....................... | 257/351 |
| 5,426,062 A | * | 6/1995 | Hwang | ....................... | 438/154 |
| 5,604,707 A | * | 2/1997 | Kuge et al. | ................. | 365/226 |
| 5,641,980 A | * | 6/1997 | Yamaguchi et al. | ........ | 257/347 |
| 5,672,995 A | * | 9/1997 | Hirase et al. | ................ | 327/534 |
| 5,838,047 A | * | 11/1998 | Yamauchi et al. | .......... | 257/372 |
| 5,923,067 A | | 7/1999 | Voldman | .................... | 257/349 |
| 5,926,703 A | | 7/1999 | Yamaguchi et al. | ........ | 438/163 |
| 6,051,452 A | | 4/2000 | Shigyo et al. | .............. | 438/151 |
| 6,074,899 A | * | 6/2000 | Voldman | .................... | 438/155 |
| 6,100,567 A | * | 8/2000 | Burr | ........................... | 257/365 |
| 6,130,572 A | * | 10/2000 | Ghilardelli et al. | ......... | 327/536 |
| 6,208,200 B1 | * | 3/2001 | Arakawa | ..................... | 327/589 |
| 6,373,321 B1 | * | 4/2002 | Yamauchi et al. | .......... | 327/534 |
| 6,406,948 B1 | * | 6/2002 | Jun et al. | .................... | 438/152 |
| 6,468,848 B1 | * | 10/2002 | Awaka et al. | ............... | 438/199 |
| 6,486,515 B2 | * | 11/2002 | Jun et al. | .................... | 257/360 |
| 6,535,052 B2 | * | 3/2003 | Myono | ....................... | 327/536 |
| 6,580,126 B1 | * | 6/2003 | Suzumura et al. | .......... | 257/343 |
| 6,614,699 B2 | * | 9/2003 | Tanzawa | ................ | 365/189.11 |
| 6,661,042 B2 | * | 12/2003 | Hsu | ........................... | 257/239 |
| 6,677,805 B2 | * | 1/2004 | Shor et al. | .................. | 327/536 |
| 6,693,325 B1 | * | 2/2004 | Ko et al. | .................... | 257/347 |
| 2003/0038670 A1 | * | 2/2003 | Li | ............................... | 327/536 |
| 2003/0207504 A1 | * | 11/2003 | Fuselier et al. | ............. | 438/151 |

FOREIGN PATENT DOCUMENTS

| EP | 0 480 373 A2 | | 4/1992 | ......... | H01L/29/784 |
|---|---|---|---|---|---|
| EP | 0 694 977 A2 | | 1/1996 | ......... | H01L/29/786 |
| EP | 0694977 | * | 5/1996 | ......... | H01L/29/786 |

* cited by examiner

*Primary Examiner*—Long Pham
*Assistant Examiner*—Thao X. Le
(74) *Attorney, Agent, or Firm*—Williams, Morgan & Amerson, P.C.

(57) ABSTRACT

In one example, a method of forming a transistor above a silicon-on-insulator substrate comprised of a bulk substrate, a buried oxide layer and an active layer, the bulk substrate being doped with a first type of dopant material is disclosed. The method comprises performing a first ion implant process using a dopant material that is of a type opposite the first type of dopant material to form a first well region within the bulk substrate, performing a second ion implant process using a dopant material that is the same type as the first type of dopant material to form a second well region in the bulk substrate within the first well, the transistor being formed in the active layer above the second well, forming a conductive contact to the first well and forming a conductive contact to the second well.

44 Claims, 13 Drawing Sheets

BIASED, TRIPLE-WELL FULLY DEPLETED SOI STRUCTURE, AND VARIOUS METHODS OF MAKING AND OPERATING SAME

BACKGROUND OF THE INVENTION

1. Field of the Invention

This invention relates generally to semiconductor fabrication technology, and, more particularly, to a biased, triple-well fully depleted SOI structure, and various methods of making and operating same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

As transistors are continually scaled in keeping with the requirements of advancing technology, device reliability dictates an associated reduction in the power supply voltage. Hence, every successive technology generation is often accompanied by a reduction in the operating voltage of the transistor. It is known that transistor devices fabricated on silicon-on-insulator (SOI) substrates exhibit better performance at low operating voltages than do transistors of similar dimensions fabricated in bulk silicon substrates. The superior performance of SOI devices at low operating voltage is related to the relatively lower junction capacitances obtained on an SOI device as compared to a bulk silicon device of similar dimensions. The buried oxide layer in an SOI device separates active transistor regions from the bulk silicon substrate, thus reducing junction capacitance.

FIG. 1 depicts an example of an illustrative transistor 10 fabricated on an illustrative silicon-on-insulator substrate 11. As shown therein, the SOI substrate 11 is comprised of a bulk substrate 11A, a buried oxide layer 11B, and an active layer 11C. The transistor 10 is comprised of a gate insulation layer 14, a gate electrode 16, sidewall spacers 19, a drain region 18A, and an source region 18B. A plurality of trench isolation regions 17 are formed in the active layer 11C. Also depicted in FIG. 1 are a plurality of conductive contacts 20 formed in a layer of insulating material 21. The conductive contacts 20 provide electrical connection to the drain and source regions 18A, 18B. As constructed, the transistor 10 defines a channel region 12 in the active layer 11C beneath the gate insulating layer 14. The bulk substrate 11A is normally doped with an appropriate dopant material, i.e., a P-type dopant such as boron or boron difluoride for NMOS devices, or an N-type dopant such as arsenic or phosphorous for PMOS devices. Typically, the bulk substrate 11A will have a doping concentration level on the order of approximately $10^{15}$ ions/cm$^3$. The buried oxide layer 11B may be comprised of silicon dioxide, and it may have a thickness of approximately 200–360 nm (2000–3600 Å). The active layer 11C may be comprised of a doped silicon, and it may have a thickness of approximately 5–30 nm (50–300 Å).

Transistors fabricated in SOI substrates offer several performance advantages over transistors fabricated in bulk silicon substrates. For example, complementary-metal-oxide-semiconductor (CMOS) devices fabricated in SOI substrates are less prone to disabling capacitive coupling, known as latch-up. In addition, transistors fabricated in SOI substrates, in general, have large drive currents and high transconductance values. Also, the sub-micron SOI transistors have improved immunity to short-channel effects when compared with bulk transistors fabricated to similar dimensions.

Although SOI devices offer performance advantages over bulk silicon devices of similar dimensions, SOI devices share certain performance problems common to all thin-film transistors. For example, the active elements of an SOI transistor are fabricated in the thin-film active layer 11C. Scaling of thin-film transistors to smaller dimensions requires that the thickness of the active layer 11C be reduced. However, as the thickness of the active layer 11C is reduced, the electrical resistance of the active layer 11C correspondingly increases. This can have a negative impact on transistor performance because the fabrication of transistor elements in a conductive body having a high electrical resistance reduces the drive current of the transistor 10. Moreover, as the thickness of the active layer 11C of an SOI device continues to decrease, variations in the threshold voltage ($V_T$) of the device occur. In short, as the thickness of the active layer 11C decreases, the threshold voltage of the device becomes unstable. As a result, use of such unstable devices in modern integrated circuit devices, e.g., microprocessors, memory devices, logic devices, etc., becomes very difficult if not impossible.

Additionally, off-state leakage currents are always of concern in integrated circuit design, since such currents tend to, among other things, increase power consumption. Such increased power consumption is particularly undesirable in many modern portable consumer devices employing integrated circuits, e.g., portable computers. Lastly, as device dimensions continue to decrease in fully depleted SOI structures, increased short channel effects may occur. That is, in such fully depleted devices, at least some of the field lines of the electric field of the drain 18A tend to couple to the channel region 12 of the transistor 10 through the relatively thick (200–360 nm) buried oxide layer 11B. In some cases, the electric field of the drain 18A may act to, in effect, turn on the transistor 10. Theoretically, such problems may be reduced by reducing the thickness of the buried oxide layer 11B and/or increasing the doping concentration of the bulk substrate 11A. However, such actions, if taken, would tend to increase the junction capacitance between the drain and source regions 18A, 18B and the bulk substrate 11A, thereby negating one of the primary benefits of SOI technology, i.e., reducing such junction capacitance.

The present invention is directed to a device and various methods that may solve, or at least reduce, some or all of the aforementioned problems.

SUMMARY OF THE INVENTION

The present invention is generally directed to a biased, triple-well fully depleted SOI structure, and various methods of making and operating same. In one illustrative embodiment, the device comprises a transistor formed above a silicon-on-insulator substrate comprised of a bulk substrate, a buried insulation layer and an active layer, the bulk substrate being doped with a first type of dopant material, and a first well formed in the bulk substrate, the first well being doped with a second type of dopant material that is of a type opposite the first type of dopant material. The device further comprises a second well formed in the bulk substrate within the first well, the second well being doped with a dopant material that is the same type as the first type of dopant material, the transistor being formed in the active layer above the second well, an electrical contact for the first well and an electrical contact for said second well. In further embodiments, the transistor further comprises a plurality of source/drain regions and a source/drain well is formed in the bulk substrate within the second well under each of the source/drain regions. The source/drain wells are comprised of a dopant material that is of the same type as the first type of dopant material, but the source/drain wells have a dopant concentration level of the first type of dopant material that is less than a dopant concentration level of the first type of dopant material in the second well.

In one illustrative embodiment, a method of forming a transistor above a silicon-on-insulator substrate comprised of a bulk substrate, a buried oxide layer and an active layer, the bulk substrate being doped with a first type of dopant material is disclosed. The method comprises performing a first ion implant process using a second type of dopant material that is of a type opposite the first type of dopant material to form a first well region within the bulk substrate, performing a second ion implant process using a dopant material that is the same type as the first type of dopant material to form a second well region in the bulk substrate within the first well, the transistor being formed in the active layer above the second well, forming a conductive contact to the first well and forming a conductive contact to the second well. In further embodiments, the method further comprises a plurality of source/drain regions and wherein said method further comprises performing a third ion implant process using a dopant material that is of a type opposite the first type of dopant material to result in a source/drain well in the bulk substrate under each of a plurality of source/drain regions of the transistor, the source/drain wells having a dopant concentration level of the first type of dopant material that is less than a dopant concentration level of the first type of dopant material in the second well.

BRIEF DESCRIPTION OF THE DRAWINGS

The invention may be understood by reference to the following description taken in conjunction with the accompanying drawings, in which like reference numerals identify like elements, and in which.

Figure 1:
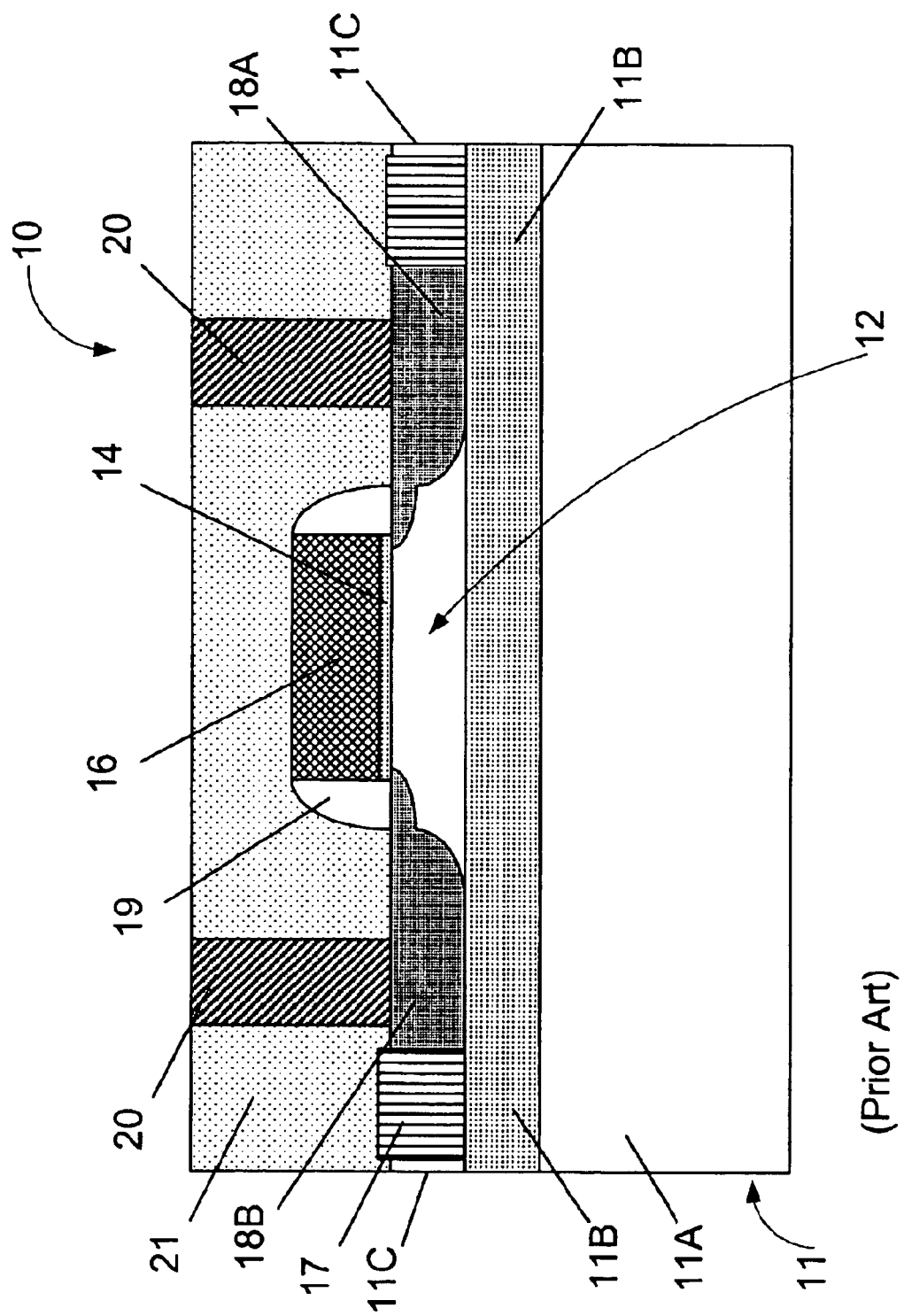
FIG. 1 is a cross-sectional view of an illustrative prior art semiconductor device formed above an SOI substrate.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present invention is directed to a biased, triple-well fully depleted SOI structure, and various methods of making and operating same. Although the present invention will be initially disclosed in the context of the formation of an illustrative NMOS transistor, those skilled in the art will understand after a complete reading of the present application that the present invention is not so limited. More particularly, the present invention may be employed with respect to a variety of technologies, e.g., NMOS, PMOS, CMOS, etc., and it may be employed with a variety of different type devices, e.g., memory devices, microprocessors, logic devices, etc.

Figure 2A:
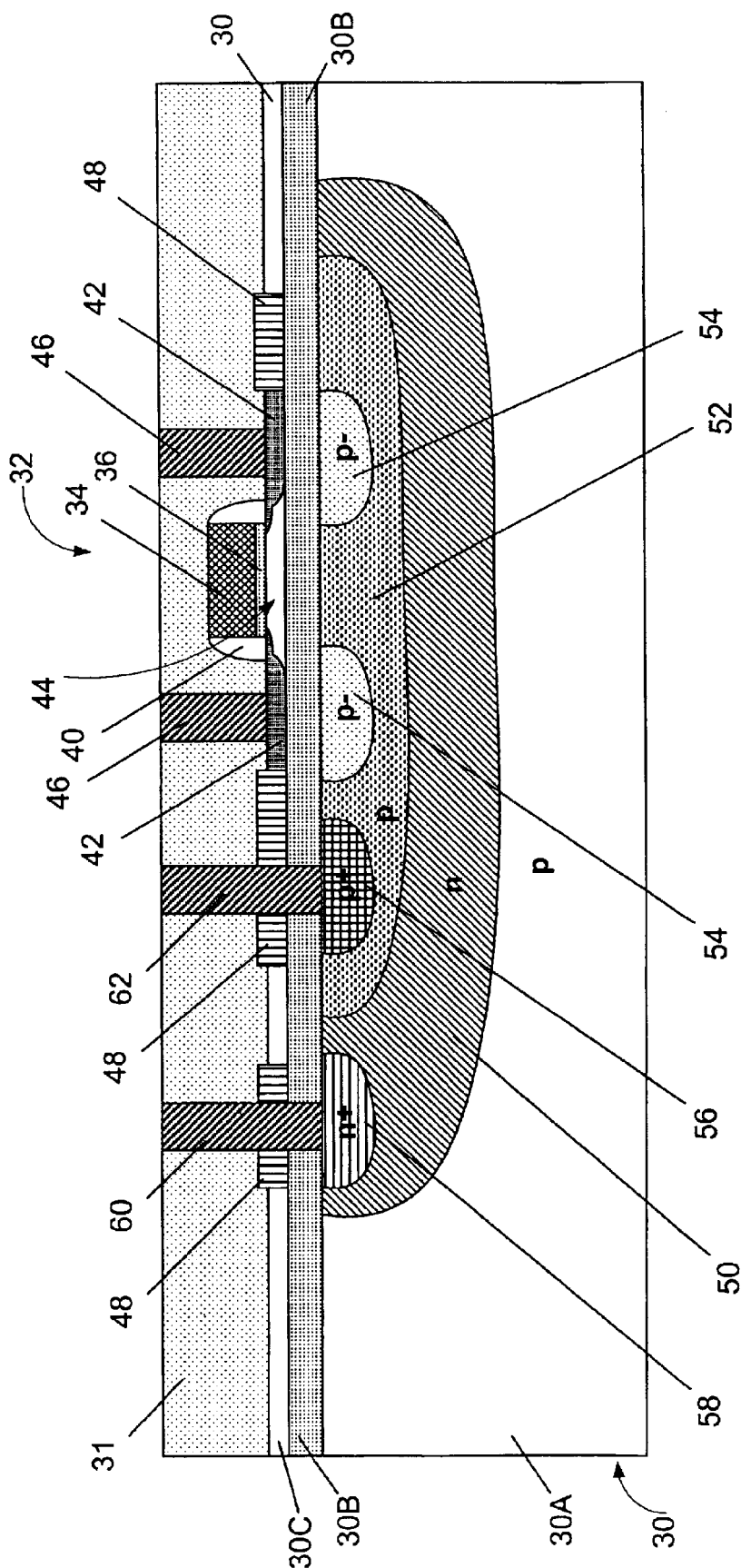
FIGS. 2A–2F are cross-sectional views depicting one illustrative method of the present invention for forming portions of an illustrative NMOS semiconductor device above an SOI substrate.

FIG. 2A depicts an illustrative NMOS transistor 32 formed in accordance with one embodiment of the present invention. As shown therein, the transistor 32 is formed above an SOI substrate 30. In one illustrative embodiment, the SOI substrate 30 is comprised of a bulk substrate 30A, a buried insulation layer 30B, and an active layer 30C. Of course, FIG. 2A only depicts a small portion of an entire substrate or wafer. In the illustrative embodiment where an NMOS device is formed, the bulk substrate 30A may be doped with a P-type dopant material, e.g., boron, boron difluoride, etc., and it my have a dopant concentration of approximately $10^{15}$ ions/cm$^3$. The buried insulation layer 30B may have a thickness that, in one embodiment, varies from approximately 5–50 nm (50–500 Å), and it may be comprised of, for example, silicon dioxide. The active layer 30C may have a thickness that varies from approximately 5–30 nm (50–300 Å), and, in the case of an NMOS device, it may be doped with a P-type dopant material. Those skilled in the art will appreciate that the thickness ranges for the buried insulation layer 30B is significantly less than the corresponding thickness of a buried insulation layer on traditional SOI structures, such as those described in the background section of the application. However, the recited details of the construction of the SOI substrate 30 should not be considered a limitation of the present invention unless such limitations are specifically set forth in the appended claims.

As shown in FIG. 2A, the transistor 32 is comprised of a gate insulation layer 36, a gate electrode 34, sidewall spacers 44 and source/drain regions 42. Also depicted in FIG. 2A are isolation regions 48 formed in the active layer 30C, a plurality of conductive contacts 46 formed in a layer of insulating material 31, and additional contacts 60 and 62. As will be recognized by those skilled in the art, the contacts 46 provide a means for establishing electrical contact with the source/drain regions 42 of the transistor 32.

According to the present invention, a plurality of doped wells are formed in the bulk substrate 30A. More particularly, as depicted in FIG. 2A, for an illustrative CMOS device, the bulk substrate 30A is typically manufactured with a P-type dopant material, such as boron or boron difluoride, at a concentration level of approximately $10^{12}$–$10^{16}$ ions/cm$^3$. A first well 50, a second well 52, a plurality of source/drain wells 54, and a plurality of contact wells 56, 58 are formed in the bulk substrate 30A in accordance with the methods disclosed herein. In the case of an illustrative NMOS transistor, the first well 50 may be doped with an N-type dopant material, such as arsenic or phosphorous, at a dopant concentration level of approximately $10^{16}$–$10^{19}$ ions/cm$^3$. Again, in the case of an NMOS device, the second well 52 may be doped with a P-type dopant material, e.g., boron or boron difluoride, at a dopant concentration level of approximately $10^{17}$–$10^{20}$ ions/cm$^3$. The source/drain wells 54 may be formed by various counter doping methods to be described more fully herein wherein the resulting concentration of the source/drain wells 54 ranges from approximately $10^{14}$–$10^{17}$ ions/cm$^3$ of a P-type dopant material for an NMOS device. The contact well 56 may be doped with a P-type dopant material at a relatively high concentration, e.g., $2\times10^{20}$ or greater ions/cm$^3$. Similarly, the N-type contact well 58 may be doped with a similar concentration level of N-type dopant atoms, e.g., arsenic, phosphorous, etc. As will be recognized by those skilled in the art after a complete reading of the present application, the various components of the transistor, e.g., the gate electrode 34 and the gate insulation layer 36, including the manner in which they are made and the materials of construction, are well-known to those skilled in the art and, thus, should not be considered a limitation of the present invention unless such limitations are specifically set forth in the appended claims.

Figure 2B:
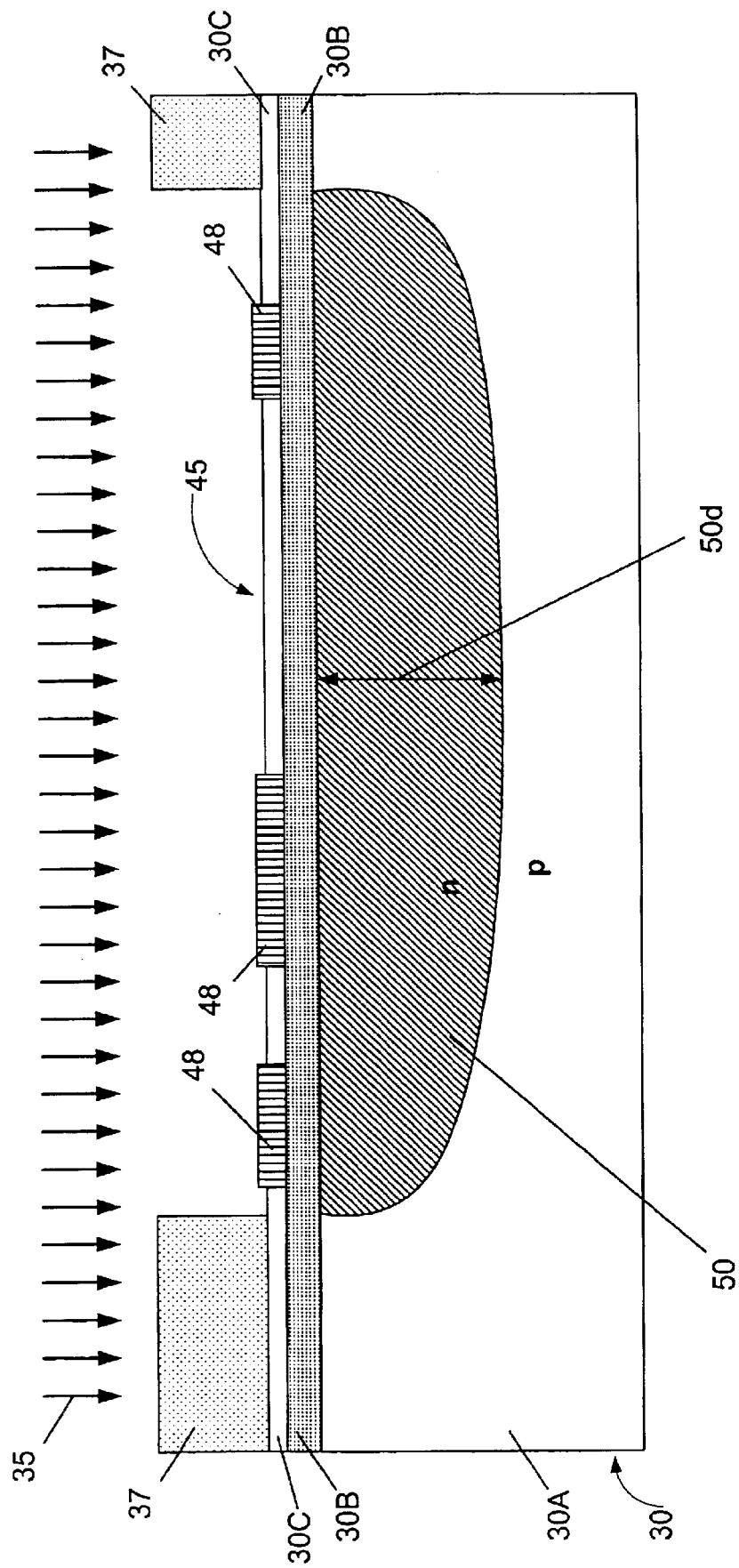

One illustrative method for forming the illustrative NMOS transistor 32 depicted in FIG. 2A will now be described with reference to FIGS. 2B–2F. Initially, as shown in FIG. 2B, a masking layer 37 is formed above the active layer 30C of the substrate 30. The masking layer 37 may be comprised of a variety of materials, such as photoresist. Thereafter, an ion implant process 35 may be performed to form the first well 50 in the bulk substrate 30A. The first well 50 may have a depth 50d that varies from approximately 50–150 nm. Again, in the context of the formation of an NMOS device, the ion implant process 35 may be performed using an N-type dopant material, such as arsenic, phosphorous, etc., at a dopant dose of approximately $5e^{10}$–$1.5e^{14}$ ions/cm$^2$. The resulting first well 50 has a dopant concentration level that ranges from approximately $10^{16}$–$10^{19}$ ions/cm$^3$. The implant energy used during the ion implant process 35 will vary depending upon the species of dopant atoms implanted. In the illustrative embodiment where phosphorous is the dopant material, the implant energy may vary from approximately 20–100 keV.

Figure 2C:
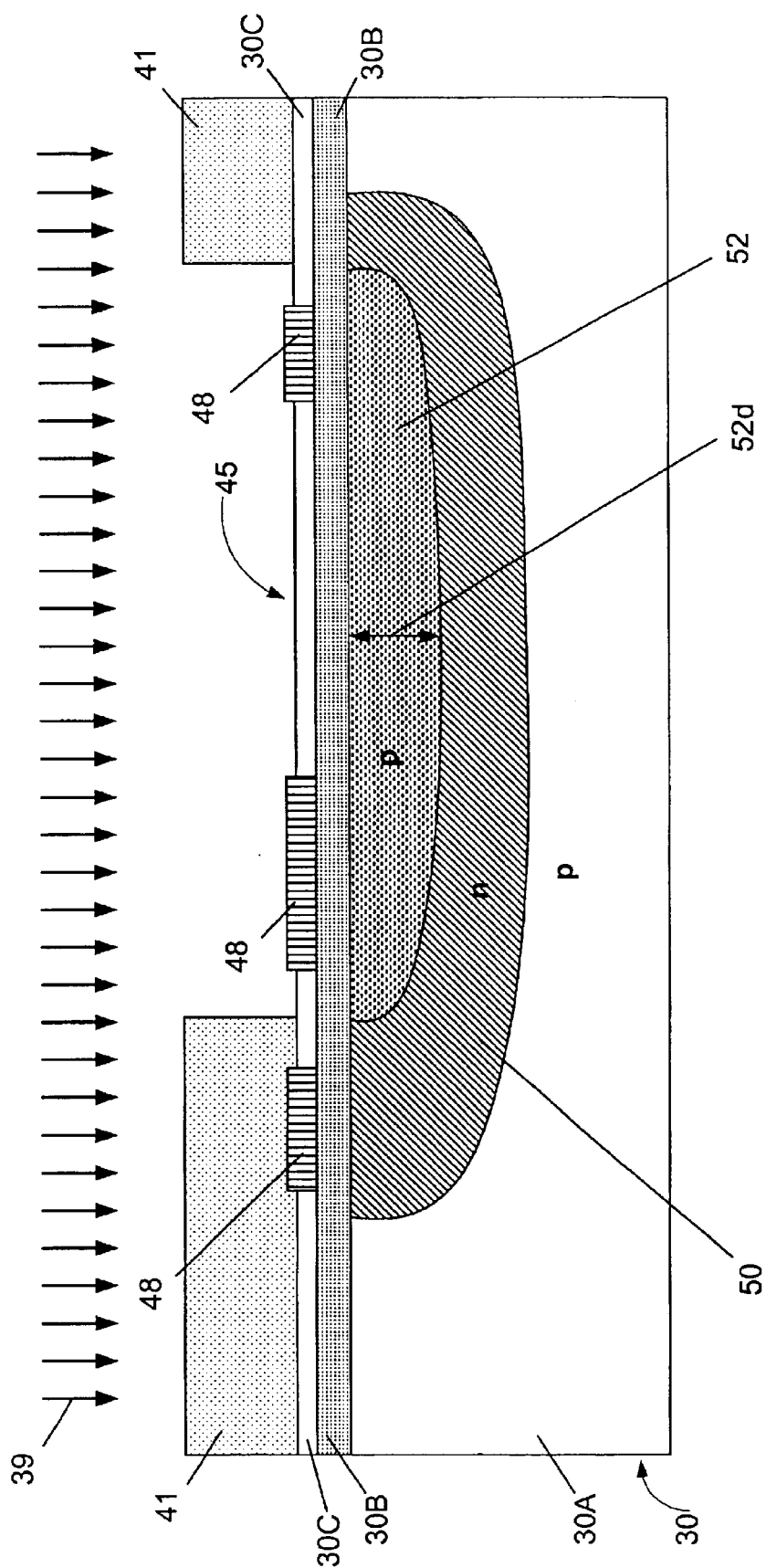

Next, the masking layer 37 depicted in FIG. 2B is removed and another masking layer 41 is formed above the active layer 30C of the substrate 30, as shown in FIG. 2C. Thereafter, another ion implant process, as indicated by arrows 39, is performed to form the second well 52 in the bulk substrate 30A. The second well 52 is doped with a second type of dopant material that is a type opposite to that of the dopant material used in the first well 50. In the case of an illustrative NMOS transistor, the second well 52 may be doped with a P-type dopant material, such as boron, boron difluoride, etc. The second well 52 may have a depth 52d that varies from approximately 40–100 nm. In one illustrative embodiment, the second well 52 has a dopant concentration of approximately $10^{17}$–$10^{20}$ ions/cm$^3$. In the context of the formation of an NMOS device, the ion implant process 39 may be performed with a P-type dopant material, e.g., boron, boron difluoride, etc., at a dopant dose of approximately $4e^{11}$–$1e^{15}$ ions/cm$^2$. The implant energy used during the implant process 39 will vary depending upon the species of the dopant atoms implanted. In the illustrative embodiment where boron is the dopant material, the implant energy may vary from approximately 5–30 keV.

Figure 2D:
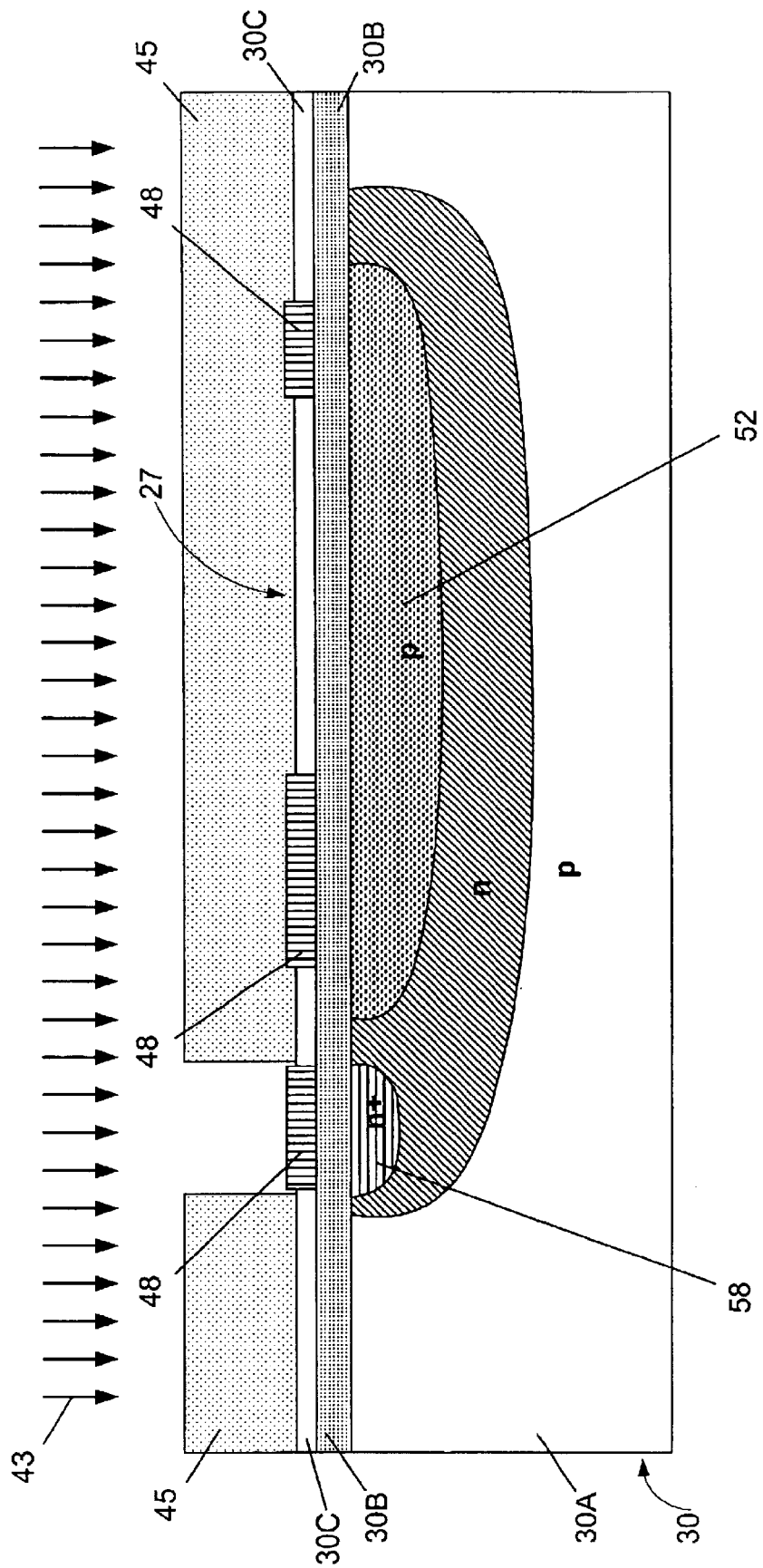

Next, the masking layer 41 depicted in FIG. 2C is removed and another masking layer 45 is formed above the substrate 30 as depicted in FIG. 2D. As shown therein, an ion implant process, as indicated by arrows 43, is performed to form a contact well 58 for the first well 50. In the illustrative example of an NMOS transistor, the contact well 58 may be doped with an N-type dopant material, such as arsenic or phosphorous, and it may be doped at a relatively high concentration level, e.g., approximately $2e^{20}$ ions/cm$^3$. This may be accomplished by using an implant dose of approximately $2e^{15}$–$5e^{15}$ ions/cm$^2$. As with the other implant processes, the implant energy will vary depending upon the dopant material implanted during the implant process 43. In the illustrative situation where arsenic is implanted during the implant process 43, the implant energy may vary from approximately 10–20 keV.

Figure 2E:
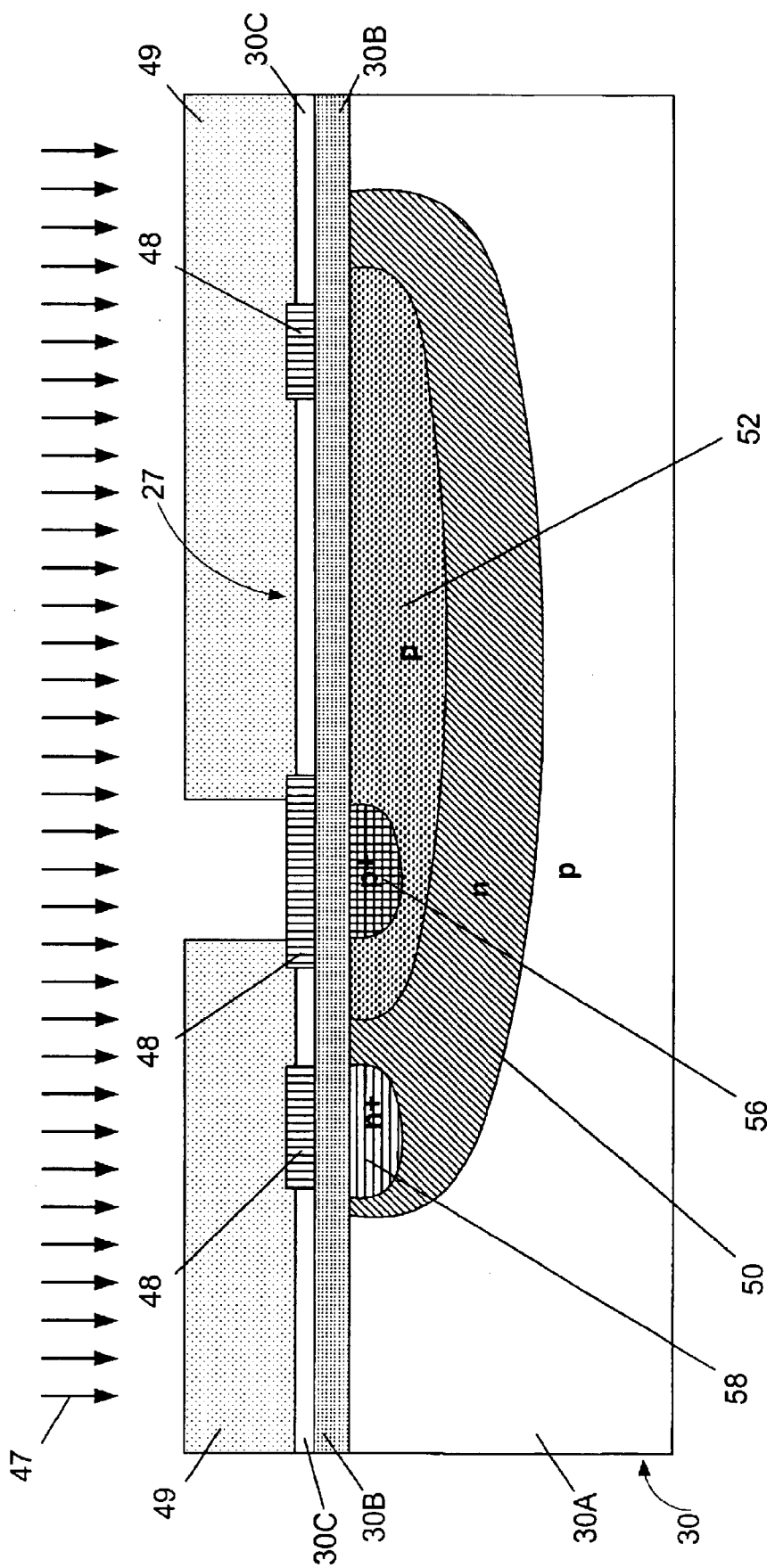

The masking layer 45 may then be removed and another masking layer 49 as indicated in FIG. 2E. Thereafter, another ion implant process 47 is performed to form contact well 56 in the second well 52. In the case of an illustrative NMOS transistor, the contact well 56 may be comprised of a P-type dopant material, such as boron, boron difluoride, etc. Moreover, the contact well 56 may have a dopant concentration level of approximately $2e^{20}$ ions/cm$^3$. This may be accomplished by using an implant dose of approximately $2e^{15}$–$5e^{15}$ ions/cm$^2$. As with the other implant processes, the implant energy will vary depending upon the dopant material implanted during the implant process 42. In the illustrative situation where boron is implanted during the implant process 47, the implant energy may vary from approximately 3–10 keV. As those skilled in the art will recognize after a complete reading of the present application, the contact wells 56, 58 may be formed after the first and second wells have been formed, and they may be formed in either order.

Figure 2F:
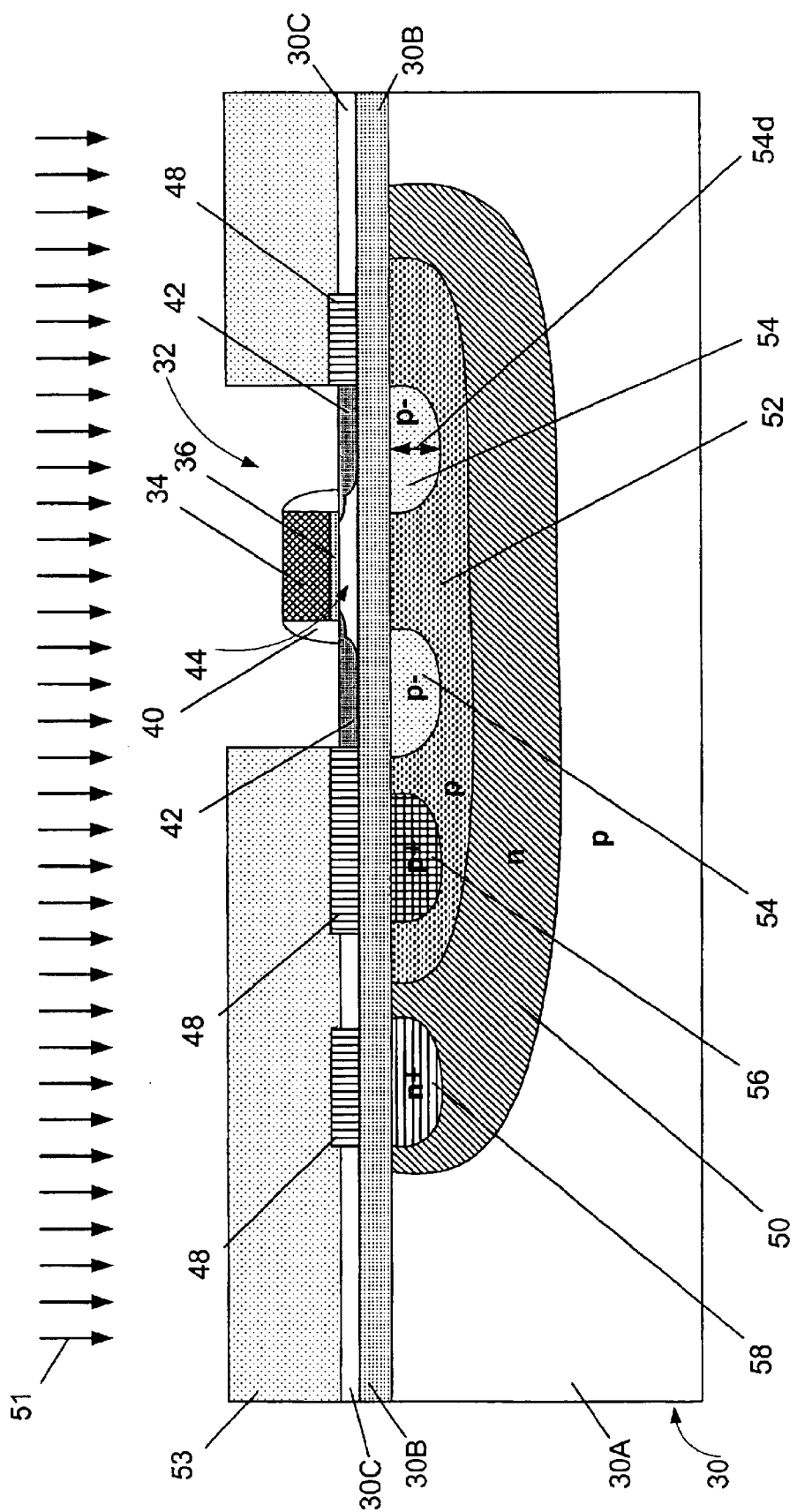

Then, as depicted in FIG. 2F, a transistor 32 is formed in the active layer 30C of the substrate 30. The illustrative transistor 32 depicted in FIG. 2F is comprised of a gate insulation layer 36, a gate electrode 34, sidewall spacers 40 and source/drain regions 42. A variety of known techniques and materials may be used in forming the various components of the illustrative transistor 32 depicted in FIG. 2F. For example, the gate insulation layer 36 may be comprised of silicon dioxide, the gate electrode 34 may be comprised of a doped polysilicon and the sidewall spacers 40 may be comprised of silicon dioxide or silicon nitride. In the case of an illustrative NMOS transistor, the source/drain regions 42 may be doped with an appropriate N-type dopant material, such as arsenic or phosphorous, and they may be formed using traditional extension implants and source/drain implants. Thus, the particular materials and methodologies used in forming the illustrative transistor 32 should not be considered limitations of the present invention unless such limitations are clearly set forth in the appended claims. Moreover, FIG. 2F does not depict all of the components of such a transistor. For example, the source/drain regions 42 may have elevated portions (not shown) formed above the active layer 30C, and/or metal silicide regions 42 formed on the source/drain regions 42 and the gate electrode 34. However, such details are not depicted for purposes of clarity.

Next, as shown in FIG. 2F, an ion implant process, as indicated by arrows 51, is performed through the masking layer 53 to form source/drain wells 54 in the bulk substrate 30A within the second well 52. The source/drain wells 54 have a depth 54d that may vary from approximately 10–90 nm. At the completion of the implant process, the source/drain wells 54 will be comprised of a dopant material that is the same type as the dopant material used for the second well 54, but the concentration level of dopant material in the source/drain wells 54 will be less than the concentration level of dopant material in the second well 52. In the case of an illustrative NMOS transistor, the source/drain wells 54 may be formed by a counter-doping technique. More particularly, in one embodiment, the source/drain wells 54 may be formed by implanting N-type dopant atoms, e.g., arsenic or phosphorous, at a dopant dose ranging from approximately $4e^{11}$–$1e^{15}$ ions/cm$^2$ into the P-type doped second well 52. The implant energy for the implant process 51 will vary depending upon the particular dopant species implanted. In the illustrative example where phosphorous is the dopant material, the implant energy for the implant process 51 may vary between approximately 15–90 keV. This will result in the source/drain wells 54 having a P-type dopant concentration of approximately $10^{15}$–$10^{17}$ ions/cm$^3$.

The purpose of the source/drain wells 54 is to reduce the dopant concentration in the bulk substrate 30A in the areas underneath the source/drain regions 42 of the transistor 32 to thereby decrease the junction capacitance of the source/drain regions 42. The implant process 51 used to form the source/drain wells 54 may be performed at any time after the gate electrode 34 of the device is formed. However, typically the implant process 51 will be performed after one or more sidewall spacers 40 are formed adjacent the gate electrode 34. Performing the implant process 51 after the sidewall spacers 40 are formed helps to insure that the bulk substrate 30A in the area under the channel region 44 of the transistor 32 remains at a relatively high dopant concentration level, e.g., approximately the same as that of the second well 52.

Moreover, performing the implant process 51 after spacer formation also helps to insure that the source/drain wells 54, having lower dopant concentration levels (as compared to the second well 52), are positioned under the source/drain regions 42 of the transistor 32 and somewhat spaced away from the channel region 44. The dopant concentration level of the source/drain wells 54 should be as low as possible, and the doping level of the wells 54 can be greater than, less than, or equal to the dopant concentration level in the bulk substrate 30A.

Thereafter, the masking layer 53 of FIG. 2F is removed and traditional processing techniques may be performed to complete the formation of the transistor 32. For example, as shown in FIG. 2A, a layer of insulating material 31 may be formed above the active layer 32 and a plurality of source/drain contacts 46 may be formed to provide electrical connection to the source/drain regions 42. An additional contact 60 may be formed to provide electrical connection to the first well 50, and another contact 62 may be formed to provide electrical connection to the second well 52.

As described herein, some of the various doped regions may be doped with the same type of dopant material, i.e., N-type or P-type. For example, for an illustrative NMOS transistor, the second well 52, the bulk substrate 30A and the source/drain wells 54 are all doped with a P-type dopant material. However, the various doped regions need not be doped with the same species of dopant material, although in some cases they may be. For example, in the case of an NMOS device, the bulk substrate 30A and the second well 52 may be doped using boron difluoride, while the source/drain wells 54 may be doped with boron. Thus, the particular species used in forming the various implant regions depicted herein should not be considered as a limitation of the present invention unless such limitations are expressly recited in the appended claims. Moreover, the various implant regions depicted herein may be subject to standard anneal processes after the implantation processes are performed, or a lower temperature anneal process may be performed in an effort to limit movement of the implanted dopant materials.

The construction of a transistor 32 in accordance with the present invention provides many useful benefits. For example, when the transistor 32 is off, a negative voltage on the order of approximately −0.1−−2.0 volts may be applied to the second well 52 via contact 62, thereby reducing leakage current when the device 32 is off. Alternatively, when the transistor 32 is on, the second well 52 may be positively biased by applying a voltage of approximately 0.1–1.0 volts via contact 62. By applying this positive bias to the well 52, the drive current of the transistor 32 may be increased, thereby tending to increase overall operating speed of the transistor 32 and integrated circuit incorporating such a transistor. This ability to modulate the same transistor to have low leakage current and high drive current is well-suited for incorporation into low-power, high-performance integrated circuit designs.

Figure 3A:
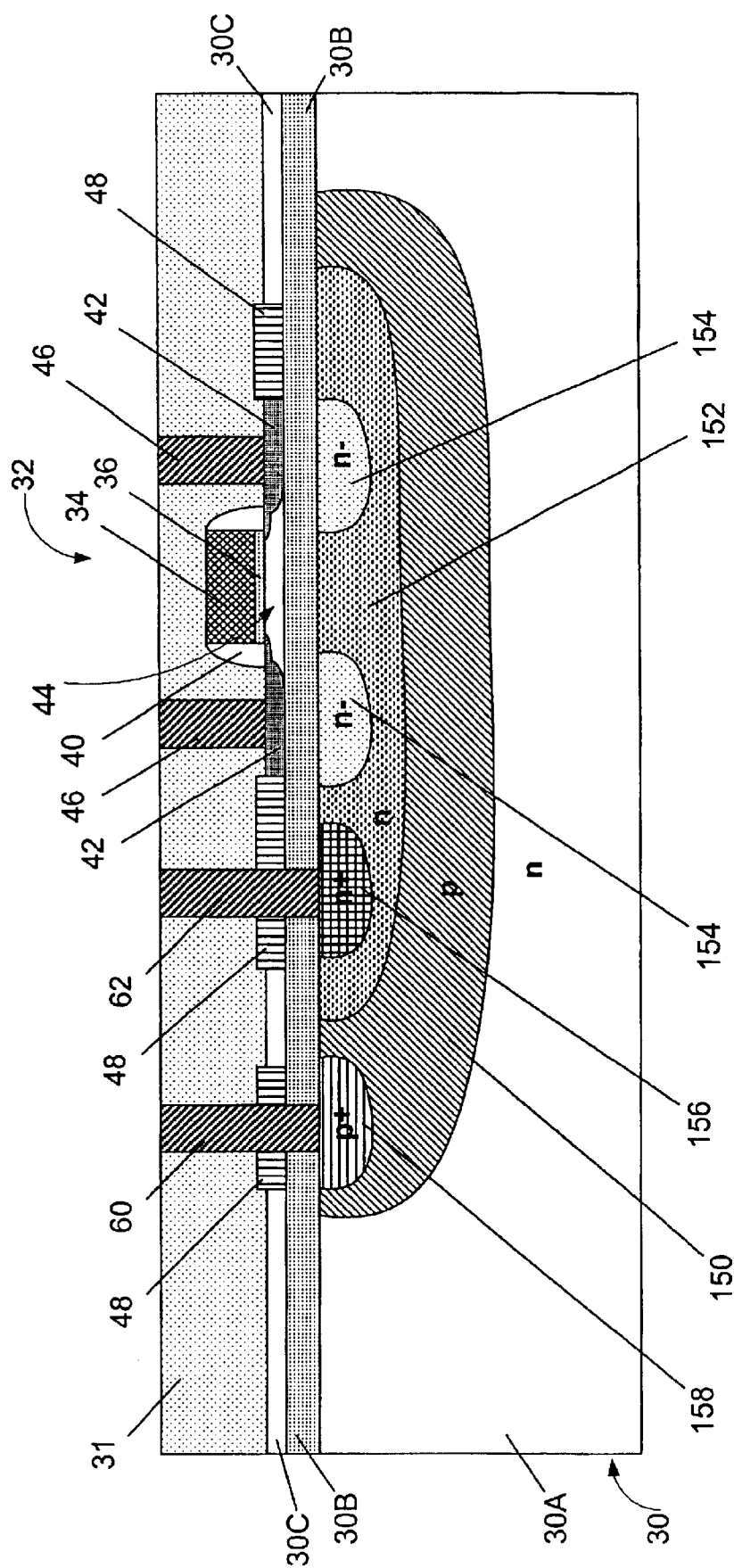
FIGS. 3A–3F are cross-sectional views depicting one illustrative method of the present invention for forming portions of an illustrative PMOS semiconductor device above an SOI substrate.

FIGS. 3A–3F depict the present invention in the illustrative embodiment of a PMOS transistor 32 device. In the description of the PMOS device, corresponding reference numbers will be used for similar components previously described. The PMOS transistor 32 depicted in FIGS. 3A–3F may be formed by, in general, performing similar implant processes to those described for the NMOS device depicted in FIGS. 2A–2F using a corresponding opposite type of dopant material. More particularly, the PMOS transistor 3 is comprised of a gate insulation layer 36, the gate electrode 34, sidewall spacers 40 and source/drain regions 43. Also depicted in FIG. 3A are isolation regions 48 formed in the active layer 30C, a plurality of conductive contacts 46 formed in a layer of insulating material 31, and additional contacts 60 and 62. As depicted in FIG. 3A, for an illustrative PMOS device, the bulk substrate 30A may be doped with an N-type dopant material, such as arsenic or phosphorous, at a concentration level of approximately $10^{12}$–$10^{16}$ ions/cm$^3$. A first well 150, a second well 152, source/drain wells 154, and contact wells 156, 158 are formed in the bulk substrate 30A in accordance with the methods disclosed herein. In the case of an illustrative PMOS transistor, the first well 150 may be doped with a P-type dopant material, such as boron r boron difluoride, at a dopant concentration level of approximately $10^{17}$–$10^{20}$ ions/cm$^3$. Again, in the case of a PMOS device, the second well 152 may be doped with an N-type dopant material, e.g., arsenic or phosphorous, at a dopant concentration level of approximately $10^{16}$–$10^{19}$ ion/cm$^3$. The source/drain wells 154 may be formed by various counter doping methods to be described more fully herein wherein the resulting concentration of the source/drain wells 54 ranges from approximately $10^{14}$–$10^{17}$ ions/cm$^3$ of an N-type dopant material for a PMOS device. The contact well 156 may be doped with an N-type dopant material at a relatively high concentration, e.g., $2 \times 10^{20}$ ions/cm$^3$ or greater. Similarly, the P-type contact well 158 may be doped with a similar concentration level of P-type dopant atoms, e.g., boron, boron difluoride, etc. As will be recognized by those skilled in the art after a complete reading of the present application, the various components of the transistor 32, including the manner in which they are made and the materials of construction, are well-known to those skilled in the art and, thus, should not be considered a limitation of the present invention unless such limitations are specifically set forth in the appended claims.

Figure 3B:
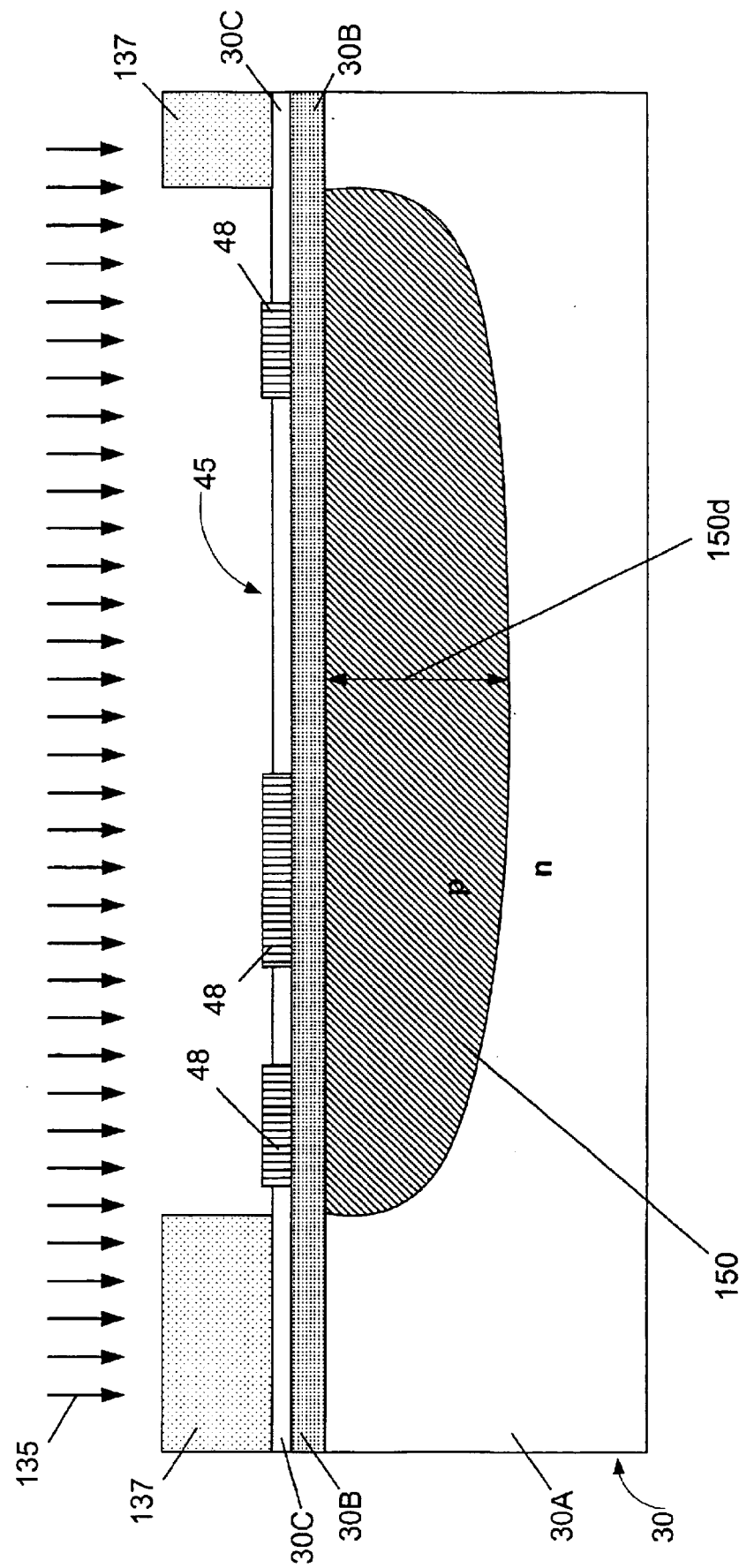

One illustrative method for forming the illustrative PMOS transistor 32 depicted in FIG. 3A will now be described with reference to FIGS. 3B–3F. Initially, as shown in FIG. 3B, a masking layer 137 is formed above the active layer 30C of the substrate 30. Thereafter, an ion implant process 135 may be performed to form the first well 150 in the bulk substrate 30A. The first well 150 may have a depth 150$d$ that varies from approximately 50–150 nm. Again, in the context of the formation of a PMOS device, the ion implant process 135 may be performed using a P-type dopant material, such as boron, boron difluoride, etc., at a dopant dose of approximately $5e^{10}$–$1.5e^{14}$ ions/cm$^2$. The resulting first well 150 has a dopant concentration level that ranges from approximately $10^{16}$–$10^{19}$ ions/cm$^3$. The implant energy used during the ion implant process 135 will vary depending upon the species of dopant atoms implanted. In the illustrative embodiment where boron is the dopant material, the implant energy may vary from approximately 10–45 keV.

Figure 3C:
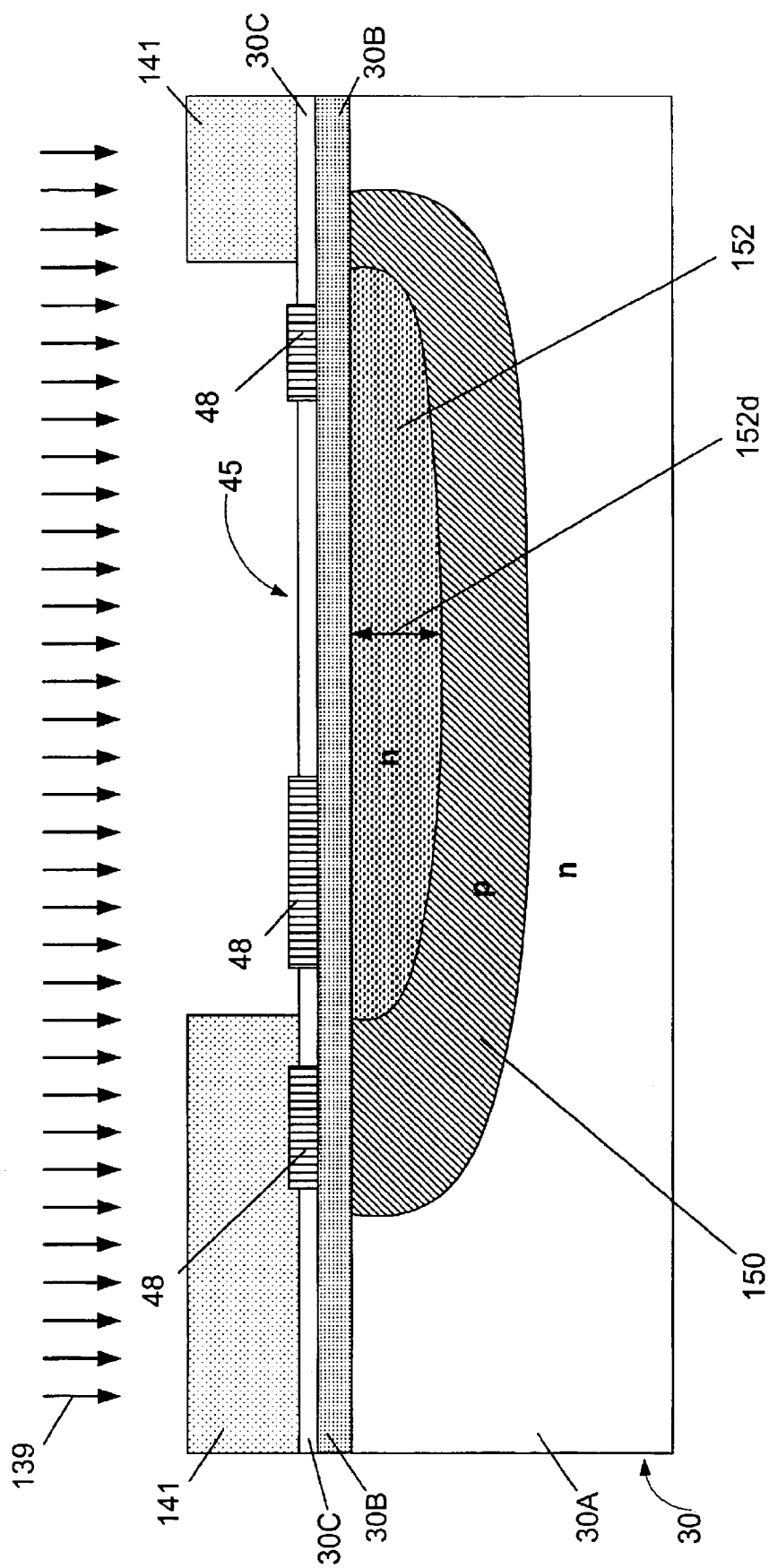

Thereafter, as shown in FIG. 3C, another ion implant process, as indicated by arrows 139, is performed through the masking layer 141 to form the second well 152 in the bulk substrate 30A. The second well 152 is doped with a dopant material that is a type opposite to that of the dopant material used in the first well 150. In the case of an illustrative PMOS transistor, the second well 152 may be doped with an N-type dopant material, such as arsenic, phosphorous, etc. The second well 152 may have a depth 152$d$ that varies from approximately 40–100 nm. In one illustrative embodiment, the second well 152 has a dopant concentration of approximately $10^{17}$–$10^{20}$ ions/cm$^3$. In the context of the formation of a PMOS device, the ion implant process 139 may be performed with an N-type dopant material, e.g., arsenic, phosphorous, etc., at a dopant dose of approximately $4e^{11}$–$1e^{15}$ ions/cm$^2$. The implant energy used during the implant process 139 will vary depending upon the species of the dopant atoms implanted. In the illustrative embodiment where arsenic is the dopant material, the implant energy may vary from approximately 10–35 keV.

Figure 3D:
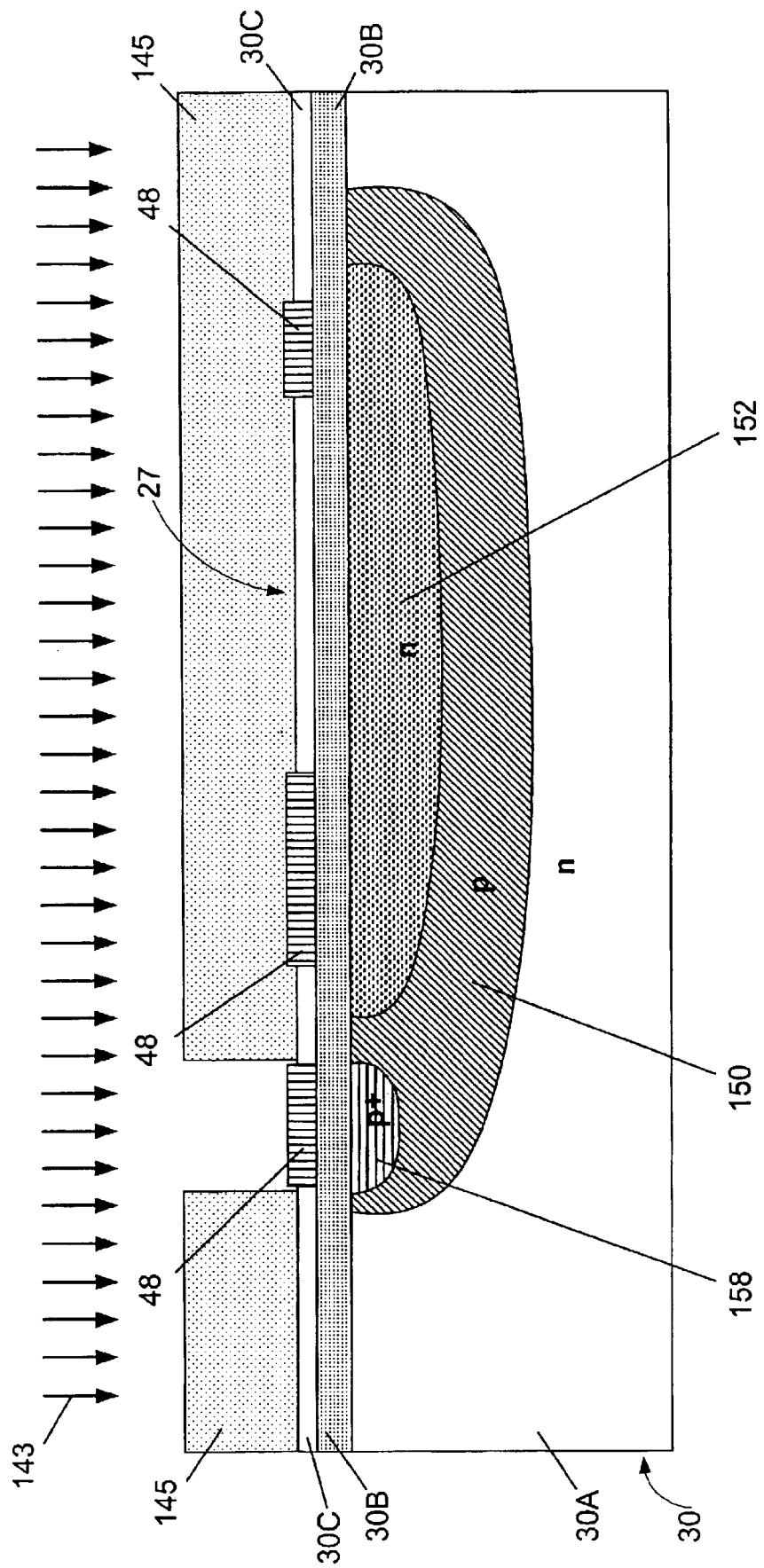

Next, as depicted in FIG. 3D, another ion implant process, as indicated by arrows 143, is performed through the masking layer 145 to form a contact well 158 for the first well 150. In the illustrative example of a PMOS transistor, the contact well 158 may be doped with a P-type dopant material, such as boron or boron difluoride, and it may be doped at a relatively high concentration level, e.g., approximately $2e^{20}$ ion/cm$^3$. This may be accomplished by using an implant dose of approximately $2e^{15}$–$5e^{15}$ ions/cm$^2$. As with the other implant processes, the implant energy will vary depending upon the dopant material implanted during the implant process 143. In the illustrative situation where boron is implanted during the implant process 143, the implant energy may vary from approximately 3–10 keV.

Figure 3E:
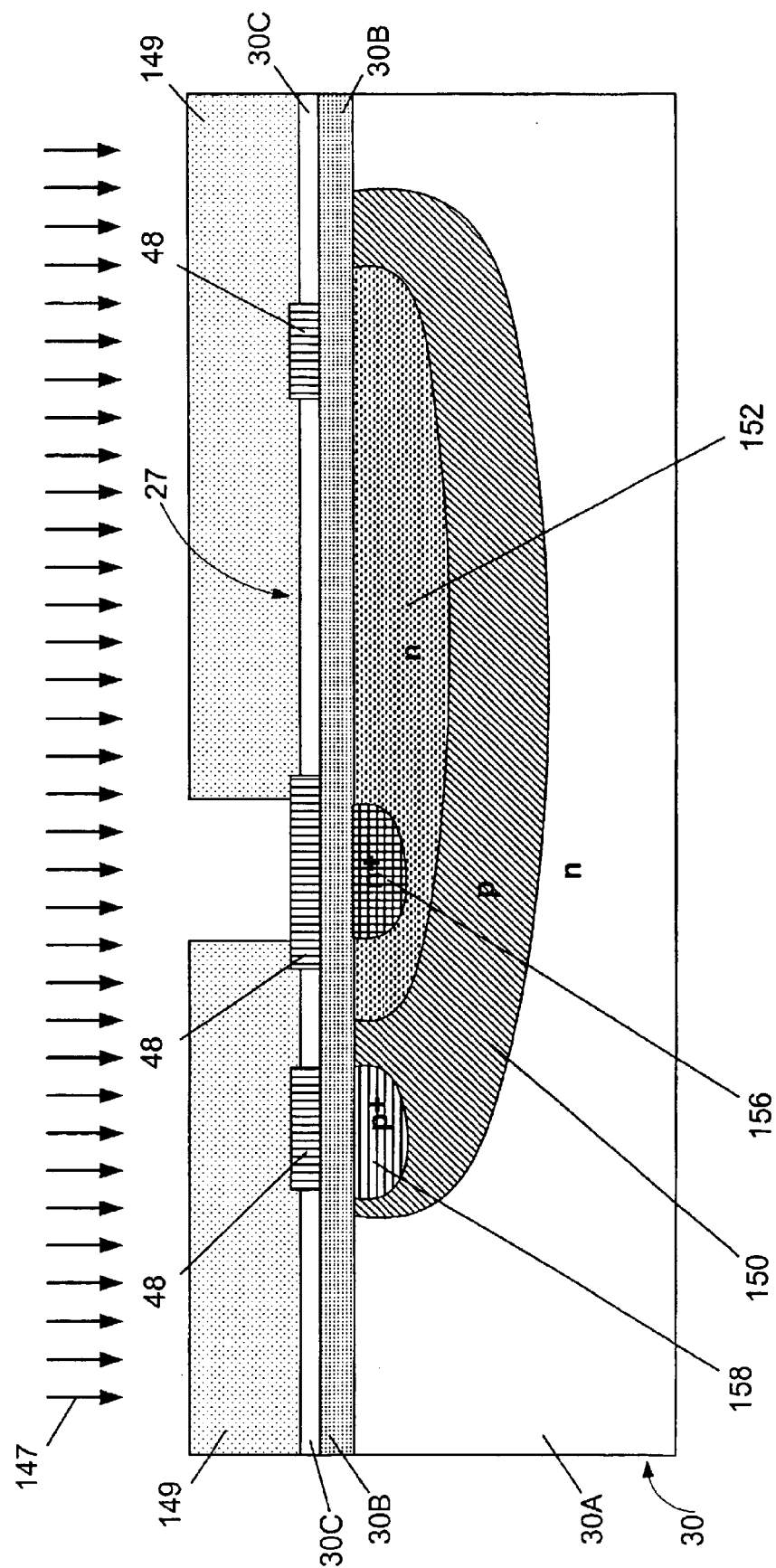

Thereafter, as shown in FIG. 3E, another ion implant process 147 is performed through a masking layer 149 to form contact well 156 in the second well 152. In the case of an illustrative PMOS transistor, the contact well 156 may be comprised of an N-type dopant material, such as arsenic, phosphorous, etc. Moreover, the contact well 156 may have a dopant concentration level of approximately $2e^{20}$ ions/cm$^3$. This may be accomplished by using an implant dose of approximately $2e^{15}$–$5e^{15}$ ions/cm$^2$. As with the other implant processes, the implant energy will vary depending upon the dopant material implanted during the implant process 143. In the illustrative situation where arsenic is implanted during the implant process 143, the implant energy may vary from approximately 10–20 keV. As those skilled in the art will recognize after a complete reading of the present application, the contact wells 156, 158 may be formed in either order.

Figure 3F:
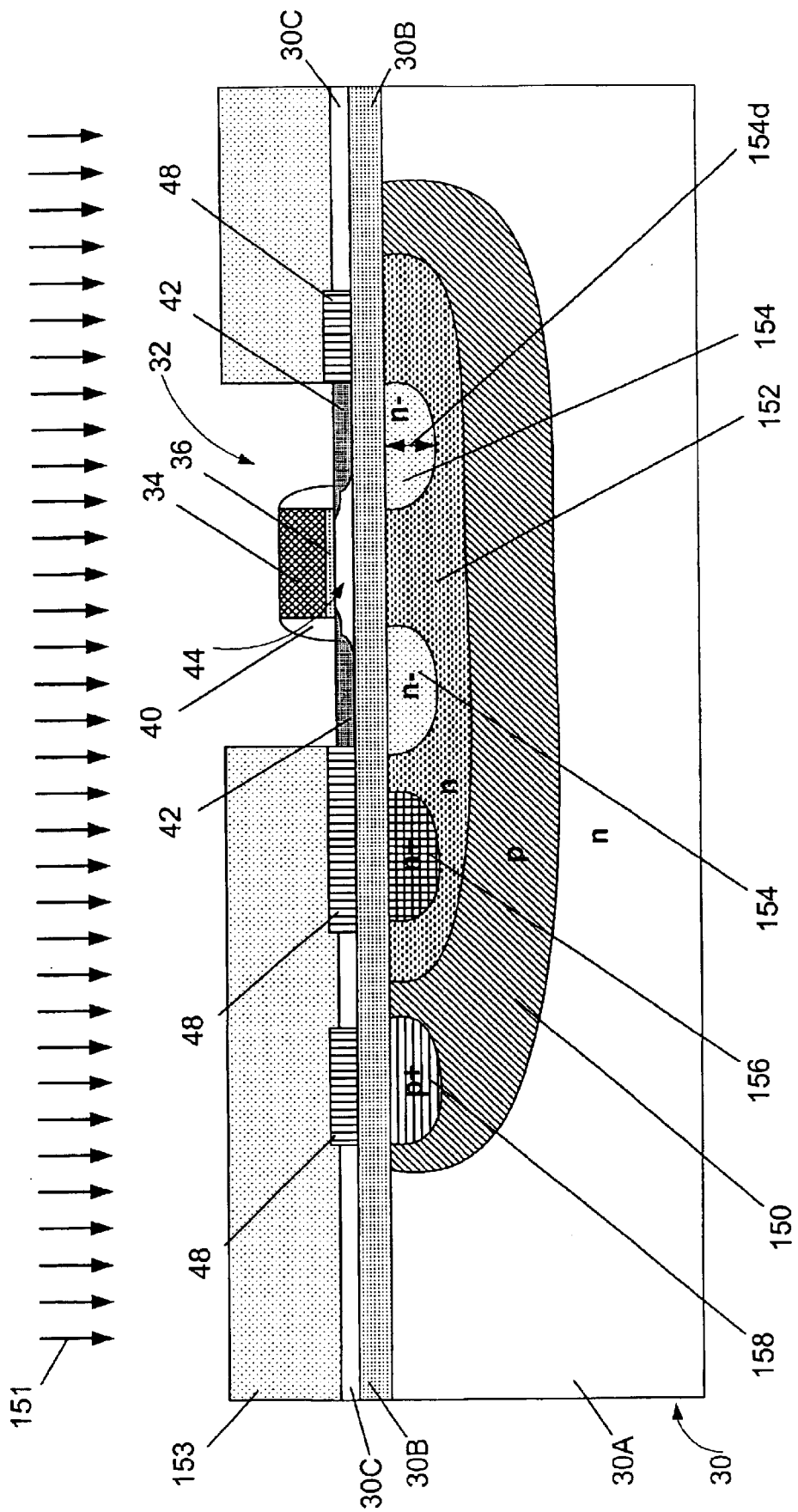

Then, as depicted in FIG. 3F, a transistor 32 is formed in the active layer 30C of the substrate 30 using traditional manufacturing techniques and materials. In the case of an illustrative PMOS transistor, the source/drain regions 42 may be doped with an appropriate P-type dopant material, such as boron or boron difluoride, and they may be formed using traditional extension implants and source/drain implants.

Next, as shown in FIG. 3F, an ion implant process, as indicated by arrows 151, is performed through the masking layer 153 to form source/drain wells 154 in the bulk substrate 30A within the second well 152. The source/drain wells 154 have a depth 154$d$ that may vary from approximately 10–90 nm. At the completion of the implant process, the source/drain wells 154 will be comprised of a dopant material that is the same type as the dopant material used for the second well 154, but the concentration level of dopant material in the source/drain wells 154 will be less than the concentration level of dopant material in the second well 152. In the case of an illustrative PMOS transistor, the source/drain wells 54 may be formed by a counter-doping technique. More particularly, in one embodiment, the source/drain wells 154 may be formed by implanting P-type dopant atoms, e.g. boron or boron difluoride, at a dopant dose ranging from approximately $4e^{11}$–$1e^{15}$ ions/cm$^2$ into the N-doped second well 152. The implant energy for the implant process 151 will vary depending upon the particular dopant species implanted. In the illustrative example where boron is the dopant material, the implant energy for the implant process 151 may vary between approximately 10–25 keV. This will result in the source/drain wells 154 having an N-type dopant concentration level of approximately $10^{15}$–$10^{17}$ ions/cm$^3$. Similar to the NMOS device, the implant process 151 used to form the source/drain wells 154 may be performed at any time after the gate electrode 34 of the device is formed. However, typically the implant process 151 will be performed after one or more sidewall spacers 40 are formed adjacent the gate electrode 34. Thereafter, the masking layer 153 of FIG. 3F is removed and traditional processing techniques may be performed to complete the formation of the transistor 32.

In this embodiment, when the PMOS transistor 32 is off, a positive voltage on the order of approximately 0.1–2.0 volts may be applied to the second well 152 via contact 162, thereby reducing leakage current when the device 32 is off. Alternatively, when the PMOS transistor 32 is on, the second well 152 may be negatively biased by applying a voltage of approximately −0.1—1.0 volts via contact 162. By applying this negative bias to the well 152, the drive current of the PMOS transistor 32 may be increased, thereby tending to increase overall operating speed of the PMOS transistor 32 and integrated circuit incorporating such a transistor.

The present invention is generally directed to a biased, triple-well fully depleted SOI structure, and various methods of making and operating same. In one illustrative embodiment, the device comprises a transistor formed above a silicon-on-insulator substrate comprised of a bulk substrate, a buried insulation layer and an active layer, the bulk substrate being doped with a first type of dopant material, and a first well formed in the bulk substrate, the first well being doped with a second type of dopant material that is of a type opposite the first type of dopant material. The device further comprises a second well formed in the bulk substrate within the first well, the second well being doped with a dopant material that is the same type as the first type of dopant material, the transistor being formed in the active layer above the second well, an electrical contact for the first well and an electrical contact for said second well. In further embodiments, the transistor further comprises a plurality of source/drain regions and a source/drain well is formed in the bulk substrate within the second well under each of the source/drain regions. The source/drain wells are comprised of a dopant material that is of the same type as the first type of dopant material, but the source/drain wells have a dopant concentration level of the first type of dopant material that is less than a dopant concentration level of the first type of dopant material in the second well.

In one illustrative embodiment, a method of forming a transistor above a silicon-on-insulator substrate comprised of a bulk substrate, a buried oxide layer and an active layer, the bulk substrate being doped with a first type of dopant material is disclosed. The method comprises performing a first ion implant process using a second type of dopant material that is of a type opposite the first type of dopant material to form a first well region within the bulk substrate, performing a second ion implant process using a dopant material that is the same type as the first type of dopant material to form a second well region in the bulk substrate within the first well, the transistor being formed in the active layer above the second well, forming a conductive contact to the first well and forming a conductive contact to the second well. In further embodiments, the method further comprises a plurality of source/drain regions and wherein said method further comprises performing a third ion implant process using a dopant material that is of a type opposite the first type of dopant material to result in a source/drain well in the bulk substrate under each of a plurality of source/drain regions of the transistor, the source/drain wells having a dopant concentration level of the first type of dopant material that is less than a dopant concentration level of the first type of dopant material in the second well.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a transistor comprised of a plurality of source/drain regions above a silicon-on-insulator substrate comprised of a bulk substrate, a buried oxide layer and an active layer, the bulk substrate being doped with a first type of dopant material, the method comprising:

performing a first ion implant process using a dopant material that is of a type opposite said first type of dopant material to form a first well region within said bulk substrate;

performing a second ion implant process using a dopant material that is the same type as said first type of dopant material to form a second well region in said bulk substrate within said first well, said transistor being formed in said active layer above said second well;

performing a third ion implant process using a dopant material that is of a type opposite said first type of dopant material to result in a source/drain well in said bulk substrate under each of said source/drain regions, said source/drain well having a dopant concentration level of said first type of dopant material that is less than a dopant concentration level of said first type dopant material in said second well;

forming a conductive contact to said first well; and forming a conductive contact to said second well.

2. The method of claim 1, wherein said transistor further comprises a gate electrode and wherein said third ion implant process is performed after said gate electrode is formed.

3. The method of claim 1, wherein said transistor further comprises a gate electrode and a sidewall spacer an wherein said third ion implant process is performed after said sidewall spacer is formed.

4. The method of claim 1, further comprising performing a fourth ion implant process to form a contact well in said bulk substrate within said first well, said fourth ion implant process being performed with a second type of dopant material that is of a type opposite said first type of dopant material, said contact well having a dopant concentration level of said second type of dopant material that is greater than a dopant concentration level of said second type of dopant material in sad first well.

5. The method of claim 4, further comprising performing a fifth ion implant process to form a contact well in said bulk substrate within said second well, said fifth ion implant process being performed with a dopant material that is of the same type as said first type of dopant material, said contact well having a dopant concentration level of said first type of dopant material that is greater than a dopant concentration level of said first type of dopant material in said second well.

6. The method of claim 1, wherein performing a first ion implant process comprises performing a first ion implant process at a dopant concentration dose of approximately $5e^{10}$–$1.5e^{14}$ ions/cm$^2$.

7. The method of claim 1, wherein performing a second ion implant process comprises performing a second ion implant process at a dopant concentration dose of approximately $4e^{11}$–$1e^{15}$ ions/cm$^2$.

8. The method of claim 1, wherein performing a third ion implant process comprises performing a third ion implant process at a dopant concentration dose of approximately $4e^{11}$–$1e^{15}$ ions/cm$^2$.

9. The method of claim 4, wherein performing a fourth ion implant process comprises performing a fourth ion implant process at a dopant concentration dose of approximately $2e^{15}$–$5e^{15}$ ions/cm$^2$.

10. The method of claim 5, wherein performing a fifth ion implant process comprises performing a fifth ion implant process at a dopant concentration dose of approximately $2e^{15}$–$5e^{15}$ ions/cm$^2$.

11. The method of claim 1, wherein said transistor is an NMOS device and wherein said first ion implant process is performed using an N-type dopant material and said second ion implant process is performed using a P-type dopant material.

12. The method of claim 1, wherein said transistor is a PMOS device and wherein said first ion implant process is performed using a P-type dopant material and said second ion implant process is performed using an N-type dopant material.

13. The method of claim 1, wherein said transistor is an NMOS device and wherein said third ion implant process is performed using an N-type dopant material.

14. The method of claim 1, wherein said transistor is a PMOS device and wherein said third ion implant process is performed using a P-type dopant material.

15. The method of claim 1, wherein performing a first ion implant process using a second type of dopant material that is of a type opposite said first type of dopant material to form a first well region within said bulk substrate comprises performing a first ion implant process using a second type of dopant material that is of a type opposite said first type of dopant material to form a first well region within said bulk substrate, said first well region having a dopant concentration level of said second type of dopant material of approximately $10^{16}$–$10^{19}$ ions/cm$^3$.

16. The method of claim 1, wherein performing a second ion implant process using a dopant material that is the same type as said first type of dopant material to form a second well region in said bulk substrate within said first well, said transistor being formed in said active layer above said second well, comprises performing a second ion implant process using a dopant material that is the same type as said first type of dopant material to form a second well region in said bulk substrate within said first well, said transistor being formed in said active layer above said second well, said second well having a dopant concentration level of approximately $10^{17}$–$10^{20}$ ions/cm$^3$.

17. The method of claim 1, wherein performing said third ion implant process results in said source/drain well regions having a concentration level of said first type of dopant material that ranges from approximately $10^{14}$–$10^{17}$ ions/cm$^3$.

18. The method of claim 4, wherein performing said fourth ion implant process results in said contact well within said first well having a dopant concentration level of said second type of dopant material of approximately $2e^{20}$ ions/cm$^3$.

19. The method of claim 5, wherein performing said fifth ion implant process results in said contact well within said second well having a dopant concentration level of said first type of dopant material of approximately $2e^{20}$ ions/cm$^3$.

20. A method of forming a transistor comprised of a plurality of source/drain regions above a silicon-on-insulator substrate comprised of a bulk substrate, a buried insulation layer and an active layer, the bulk substrate being doped with a first type of dopant material, the method comprising:

performing a first ion implant process using a second type of dopant material that is of a type opposite said first type of dopant material to form a first well region within said bulk substrate;

performing a second ion implant process using a dopant material that is the same type as said first type of dopant material to form a second well region in said bulk substrate within said first well, said transistor being formed in said active layer above said second well;

performing a third ion implant process using a second type of dopant material that is of a type opposite said first type of dopant material to result in a source/drain well in said bulk substrate under each of said source/drain regions, said source/drain wells having a dopant concentration level of said first type of dopant material that is less than a dopant concentration level of said first type of dopant material in said second well, said third ion implant process being performed after said gate electrode is formed;

forming a conductive contact to said first well; and forming a conductive contact to said second well.

21. The method of claim 20, wherein said transistor further comprises a gate electrode and a sidewall spacer and wherein said third ion implant process is performed after said sidewall spacer is formed.

22. The method of claim 20, further comprising performing a fourth ion implant process to form a contact well in said bulk substrate within said first well, said fourth ion implant process being performed with a second type of dopant material that is of a type opposite said first type of dopant material, said contact well having a dopant concentration level of said second type of dopant material that is greater than a dopant concentration level of said second type of dopant material in said first well.

23. The method of claim 20, further comprising performing a fifth ion implant process to form a contact well in said bulk substrate within said second well, said fifth ion implant process being performed with a dopant material that is of the same type as said first type of dopant material, said contact well having a dopant concentration level of said first type of dopant material that is greater than a dopant concentration level of said first type of dopant material in said second well.

24. The method of claim 20, wherein performing a first ion implant process comprises performing a first ion implant process at a dopant concentration dose of approximately $5e^{10}$–$1.5e^{14}$ ions/cm$^2$.

25. The method of claim 20, wherein performing a second ion implant process comprises performing a second ion implant process at a dopant concentration dose of approximately $4e^{11}$–$1e^{15}$ ions/cm$^2$.

26. The method of claim 20, wherein performing a third ion implant process comprises performing a third ion implant process at a dopant concentration dose of approximately $4e^{11}$–$1e^{15}$ ions/cm$^2$.

27. The method of claim 22, wherein performing a fourth ion implant process comprises performing a fourth ion implant process at a dopant concentration dose of approximately $2e^{15}$–$5e^{15}$ ions/cm$^2$.

28. The method of claim 23, wherein performing a fifth ion implant process comprises performing a fifth ion implant process at a dopant concentration dose of approximately $2e^{15}$–$5e^{15}$ ions/cm$^2$.

29. The method of claim 20, wherein said transistor is an NMOS device and wherein said first ion implant process is performed using an N-type dopant material, said second ion implant process is performed using a P-type dopant material, and said third ion implant process is performed using an N-type dopant material.

30. The method of claim 20, wherein said transistor is a PMOS device and wherein said first ion implant process is performed using a P-type dopant material, said second ion implant process is performed using an N-type dopant material, and said third ion implant process is performed using a P-type dopant material.

31. The method of claim 20, wherein performing a first ion implant process using a second type of dopant material that is of a type opposite said first type of dopant material to form a first well region within said bulk substrate comprises performing a first ion implant process using a second type of dopant material that is of a type opposite said first type of dopant material to form a first well region within said bulk substrate, said first well region having a dopant concentration level of said second type of dopant material of approximately $10^{16}$–$10^{19}$ ions/cm$^3$.

32. The method of claim 20, wherein performing a second ion implant process using a dopant material that is the same type as said first type of dopant material to form a second well region in said bulk substrate within said first well, said transistor being formed in said active layer above said second well, comprises performing a second ion implant process using a dopant material that is the same type as said first type of dopant material to form a second well region in said bulk substrate within said first well, said transistor being formed in said active layer above said second well, said second well having a dopant concentration level of approximately $10^{17}$–$10^{20}$ ions/cm$^3$.

33. The method of claim 26, wherein performing said third ion implant process results in said source/drain well regions having a concentration of said first type of dopant material that ranges from approximately $10^{14}$–$10^{17}$ ions/cm$^3$.

34. The method of claim 27, wherein performing said fourth ion implant process results in said contact well within said first well having a dopant concentration level of said second type of dopant material of approximately $2e^{20}$ ions/cm$^3$.

35. The method of claim 28, wherein performing said fifth ion implant process results in said contact well within said second well having a dopant concentration level of said first type of dopant material of approximately $2e^{20}$ ions/cm$^3$.

36. A method of forming a transistor comprised of a plurality of source/drain regions above a silicon-on-insulator substrate comprised of a bulk substrate, a buried oxide layer and an active layer, the bulk substrate being doped with a P-type dopant material, the method comprising:
performing a first ion implant process using an N-type dopant material to form a first well region within said bulk substrate;
performing a second ion implant process using a P-type dopant material to form a second well region in said bulk substrate within said first well, said transistor being formed in said active layer above said second well;
performing a third ion implant process using an N-type dopant material to result in a source/drain well in said bulk substrate under each of said source/drain regions, said source/drain wells having a dopant concentration level P-type dopant material that is less than a dopant concentration level of P-type dopant material in said second well, said third ion implant process being performed after said gate electrode is formed;
forming a conductive contact to said first well; and
forming a conductive contact to said second well.

37. A method of forming a transistor comprised of a plurality of source/drain regions above a silicon-on-insulator substrate comprised of a bulk substrate, a buried oxide layer and an active layer, the bulk substrate being doped with an N-type dopant material, the method comprising:
performing a first ion implant process using a P-type dopant material to form a first well region within said bulk substrate;
performing a second ion implant process using an N-type dopant material to form a second well region in said bulk substrate within said first well, said transistor being formed in said active layer above said second well;
performing a third ion implant process using a P-type dopant material to result in a source/drain well in said bulk substrate under each of said source/drain regions, said source/drain wells having a dopant concentration level of N-type dopant material that is less than a dopant concentration level of P-type dopant material in said second well, said third ion implant process being performed after said gate electrode is formed;
forming a conductive contact to said first well; and
forming a conductive contact to said second well.

38. A method of forming a transistor above a silicon-on-insulator substrate comprised of a bulk substrate, a buried oxide layer and an active layer, the bulk substrate being doped with a first type of dopant material, the method comprising:
performing a first ion implant process using a dopant material that is of a type opposite said first type of dopant material to form a first well region within said bulk substrate;
performing a second ion implant process using a dopant material that is the same type as said first type of dopant material to form a second well region in said bulk substrate within said first well, said second well defining an area, said transistor being formed in said active layer within said area defined by said second well;
forming a conductive contact to said first well; and
forming a conductive contact to said second well.

39. The method of claim 38, wherein performing a first ion implant process comprises performing a first ion implant process at a dopant concentration dose of approximately $5e^{10}$–$1.5e^{14}$ ions/cm$^2$.

40. The method of claim 38, wherein performing a second ion implant process comprises performing a second ion implant process at dopant concentration dose of approximately $4e^{11}$–$1e^{15}$ ions/cm$^2$.

41. The method of claim 38, wherein said transistor is an NMOS device and wherein said first ion implant process is performed using an N-type dopant material and said second ion implant process is performed using a P-type dopant material.

42. The method of claim 38, wherein said transistor is a PMOS device and wherein said first ion implant process is performed using a P-type dopant material and said second ion implant process is performed using an N-type dopant material.

43. The method of claim 38, wherein performing a first ion implant process using a second type of dopant material that is of a type opposite said first type of dopant material to form a first well region within said bulk substrate comprises performing a first ion implant process using a second type of dopant material that is of a type opposite said first type of dopant material to form a first well region within said bulk substrate, said first well region having a dopant concentration level of said second type of dopant material of approximately $10^{16}$–$10^{19}$ ions/cm$^3$.

44. The method of claim 38, wherein performing a second ion implant process using a dopant material that is the same type as said first type of dopant material to form a second well region in said bulk substrate within said first well, said transistor being formed in said active layer above said second well, comprises performing a second ion implant process using a dopant material that is the same type as said first type of dopant material to form a second well region in said bulk substrate within said first well, said transistor being formed in said active layer above said second well, said second well having a dopant concentration level of approximately $10^{17}$–$10^{20}$ ions/cm$^3$.

* * * * *

UNITED STATES PATENT AND TRADEMARK OFFICE
CERTIFICATE OF CORRECTION

PATENT NO.     : 6,919,236 B2
DATED          : July 19, 2005
INVENTOR(S)    : Andy C. Wei, Derick J. Wristers and Mark B. Fuselier It is certified that error appears in the above-identified patent and that said Letters Patent is hereby corrected as shown below:

Column 12,
Line 39, before "dopant" insert -- of --.
Line 47, delete "an" and insert therefor -- and --.
Line 58, delete "sad" and insert therefor -- said --.

Column 16,
Line 55, after "process at" insert -- a --.

Signed and Sealed this

Thirteenth Day of September, 2005

JON W. DUDAS
*Director of the United States Patent and Trademark Office*